(12) United States Patent
Wang

(10) Patent No.: US 12,096,550 B2
(45) Date of Patent: Sep. 17, 2024

(54) FIXING STRUCTURE

(71) Applicant: DTECH PRECISION INDUSTRIES CO., LTD., New Taipei (TW)

(72) Inventor: Ting-Jui Wang, New Taipei (TW)

(73) Assignee: DTECH PRECISION INDUSTRIES CO., LTD., New Taipei (TW)

( * ) Notice: Subject to any disclaimer, the term of this patent is extended or adjusted under 35 U.S.C. 154(b) by 211 days.

(21) Appl. No.: 17/980,570

(22) Filed: Nov. 4, 2022

(65) Prior Publication Data
US 2023/0171873 A1    Jun. 1, 2023

(30) Foreign Application Priority Data
Dec. 1, 2021    (TW) .................................. 110144855

(51) Int. Cl.
*H05K 1/00* (2006.01)
*H05K 1/02* (2006.01)

(52) U.S. Cl.
CPC . *H05K 1/0204* (2013.01); *H05K 2201/10409* (2013.01)

(58) Field of Classification Search
CPC ................... H05K 1/0204; H05K 2201/10409
See application file for complete search history.

(56) References Cited

U.S. PATENT DOCUMENTS

| 2014/0362538 A1* | 12/2014 | Su | H01L 23/4093 |
| | | | 361/720 |
| 2016/0143125 A1* | 5/2016 | Dang | H05K 1/0203 |
| | | | 24/546 |
| 2017/0105316 A1* | 4/2017 | Lin | H01L 23/4093 |

FOREIGN PATENT DOCUMENTS

TW    I745837 B    11/2021

* cited by examiner

*Primary Examiner* — Pete T Lee

(57) ABSTRACT

A fixing structure applied to arrange a heat dissipating device to a heat generating body on an object includes an entrance portion provided on the heat dissipating device and an elastic fastener provided on the object. The elastic fastener is arranged on the object, and includes a coupling head, a rod connected to the coupling head, and an elastic element sleeved on the rod. The entrance portion is in communication with a slide portion, and the elastic fastener is adapted to enter the slide portion by the rod via the entrance portion and have the coupling head contact the heat dissipating device. The elastic element is for providing an elastic force for tightly securing the coupling head on the heat dissipating device, so as to press the heat dissipating device against the heat generating body in order to dissipate heat.

12 Claims, 10 Drawing Sheets

FIXING STRUCTURE

CROSS-REFERENCE TO RELATED APPLICATION

This non-provisional application claims priority under 35 U.S.C. § 119(a) on Patent Application No(s). 110144855 filed in Taiwan, R.O.C. on Dec. 1, 2021, the entire contents of which are hereby incorporated by reference.

BACKGROUND OF THE INVENTION

1. Field of the Invention

The present disclosure provides a fixing structure, and in particular to a fixing structure applied to a heat dissipating device for dissipating heat for a heat generating component on a circuit board.

2. Description of the Related Art

A heat generating body in an electronic device is frequently provided with a heat sink to dissipate heat. In a common technique for securing a heat sink on to a heat generating body, the heat sink is pressed downward on the heat generating body.

However, the current means for securing a heat sink is quite labor consuming, and tools such as screw drivers are needed for lifting and removal, additionally leading to a labor and time consuming removal process.

BRIEF SUMMARY OF THE INVENTION

With extensive research and development, the present invention provides a fixing device in the aim of achieving an objective of quick arrangement of a heat dissipating device on to a heat generating body.

According to a first embodiment of the present disclosure, a fixing structure applied to couple to another object is provided. The fixing structure includes an entrance portion provided on the another object device and an elastic fastener provided on the object. The elastic fastener is arranged on the object, and includes a coupling head, a rod connected to the coupling head, and an elastic element sleeved on the rod. The entrance portion is in communication with a slide portion, and the elastic fastener is adapted to enter the slide portion by the rod via the entrance portion and have the coupling head contact the another object. The elastic element is for providing an elastic force for tightly securing the coupling head on the another object, so as to press the another object against the object.

According to a second embodiment of the present disclosure, a fixing structure applied another object is provided. The fixing structure includes an entrance portion provided on the another object and an elastic fastener provided on the object. The elastic fastener is arranged on the object, and includes a coupling head, a rod connected to the coupling head, and an elastic element sleeved on the rod. The entrance portion is in communication with a slide portion, or the entrance portion has a wide opening portion and is in communication with the slide portion via the wide opening portion. The elastic fastener is adapted to enter the slide portion by the rod portion via the entrance portion, and have the coupling head contact the another object. Alternatively, the elastic fastener is adapted to enter the wide opening portion by the coupling head and then have the rod enter the slide portion, so that the coupling head contacts the another object. The elastic element is for providing an elastic force for tightly securing the coupling head on the another object, so as to couple the another object to the object.

According to a third embodiment of the present disclosure, a fixing structure applied as a fixing structure of an object to couple to another object is provided. The fixing structure includes an entrance portion provided on the object and an elastic fastener provided on the another object. The entrance portion is provided on the another object, and the elastic fastener is arranged on the object and includes a coupling head, a rod connected to the coupling head, a body assembled at the rod and arranged on the object, and an elastic element sleeved on the rod. The entrance portion is in communication with a slide portion, or the entrance portion has a wide opening portion and is in communication with the slide portion via the wide opening portion. The elastic fastener is adapted to enter the slide portion by the rod portion via the entrance portion, and have the coupling head contact the another object. Alternatively, the elastic fastener is adapted to enter the wide opening portion by the coupling head and then have the rod enter the slide portion, so that the coupling head contacts the another object. The elastic element is for providing an elastic force for tightly securing the coupling head on the another object, so as to couple the another object to the object.

Thus, the fixing structure of the present disclosure is capable of quickly installing or removing a heat dissipating device to or from an object provided with a heat generating body.

DETAILED DESCRIPTION OF THE INVENTION

To facilitate understanding of the object, characteristics and effects of this present disclosure, embodiments together with the attached drawings for the detailed description of the present disclosure are provided.

Embodiments of the present disclosure are provided below.

Figure 1:
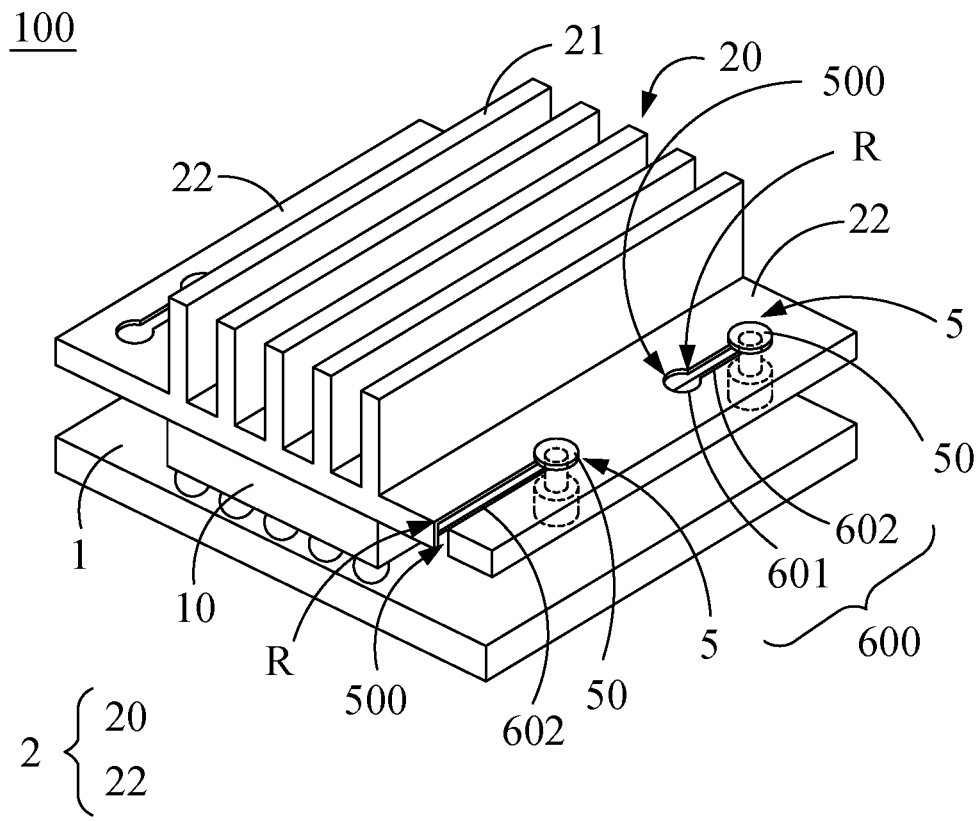
FIG. 1 is a first perspective schematic diagram of a fixing structure according to an embodiment of the present disclosure.
Figure 2:
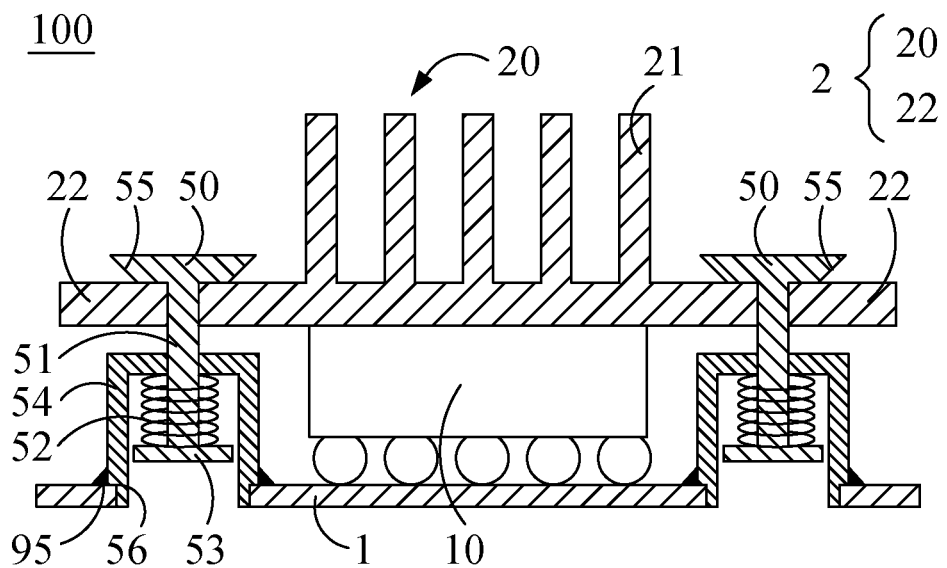
FIG. 2 is a cross section schematic diagram of the fixing structure in FIG. 1.

Referring to FIG. 1 and FIG. 2, according to a first embodiment of the present disclosure, a fixing structure 100 is provided to arrange a heat dissipating device 2 to a heat generating body 10 on an object 1. The fixing structure 100 includes an entrance portion 500 provided on the heat dissipating device 2 and an elastic fastener 5 provided on the object 1. The elastic fastener 5 is arranged on the object 1, and includes a coupling head 50, a rod 51 connected to the coupling head 50, and an elastic element 52 sleeved on the rod 51. The entrance portion 500 is in communication with a slide portion 602, and the elastic fastener 5 is adapted to enter the slide portion 602 by the rod 51 via the entrance portion 500 and have the coupling head 50 lean against the heat dissipating device 2. The elastic element 52 is for providing an elastic force for tightly securing the coupling head 50 to the head dissipating device 2, so as to press the heat dissipating device 2 against the heat generating body 10 and thereby dissipate heat.

Referring to FIG. 1 and FIG. 2, a second embodiment of the present disclosure is substantially the same as the first embodiment, and differs in that the elastic fastener 5 further includes a body 54. The body 54 is slidably connected to the rod 51 and is arranged on the object 1, or the entrance portion 500 may have a wide opening portion 601 and is in communication with the slide portion 602 via the wide opening portion 601, and the elastic fastener 5 is adapted to enter the wide opening portion 601 by the coupling head 50 and then have the rod 51 enter the slide portion 602, thereby enabling the coupling head 50 to contact the heat dissipating device 2.

Figure 3:
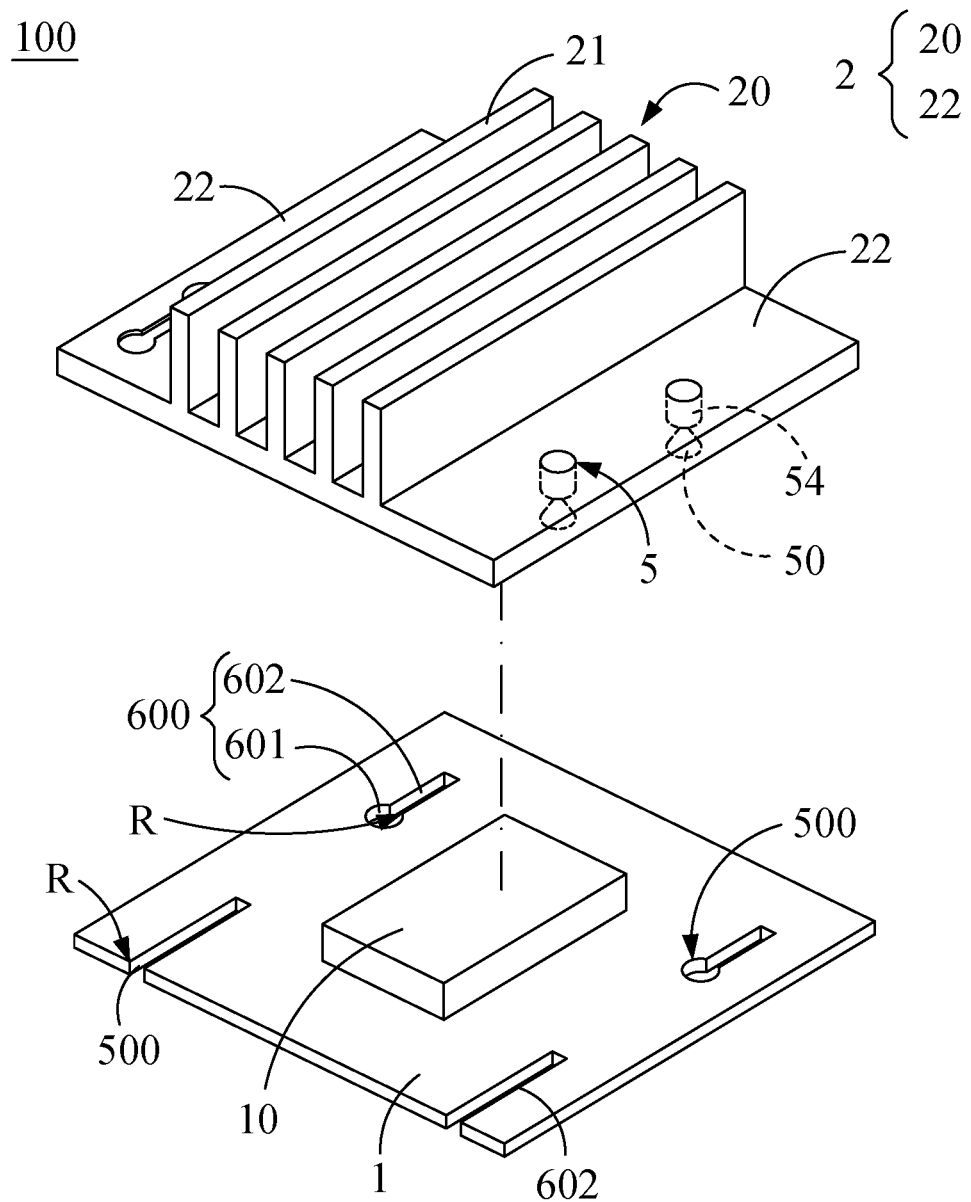
FIG. 3 is a second perspective schematic diagram of a fixing structure according to an embodiment of the present disclosure.
Figure 4:
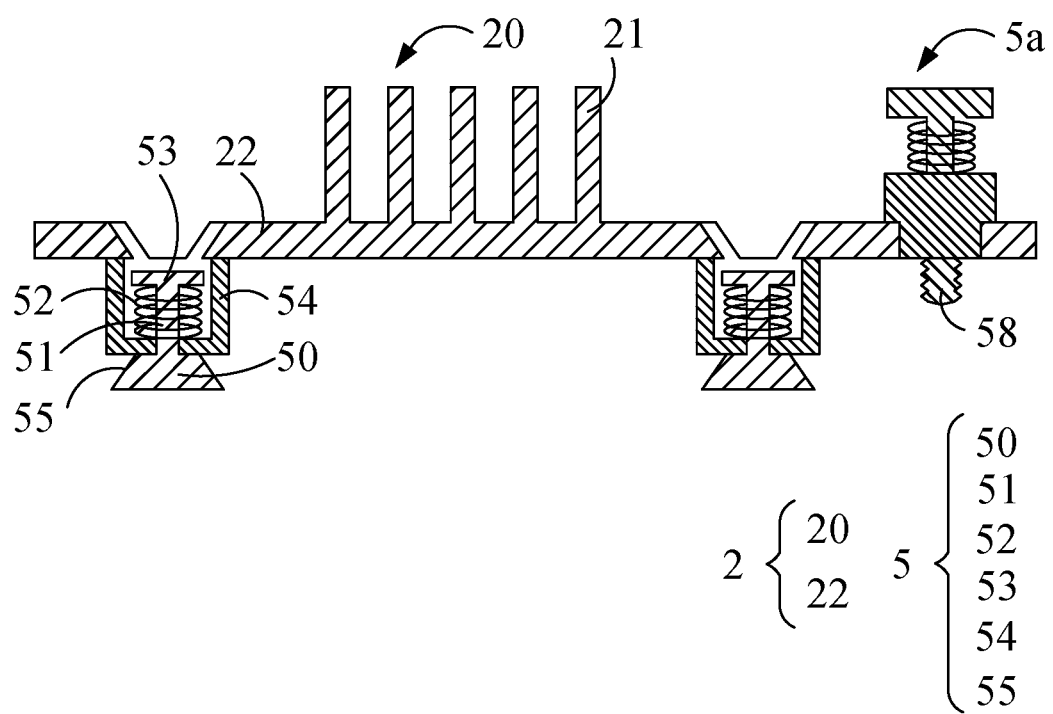
FIG. 4 is a cross section schematic diagram of a heat dissipating device in FIG. 3.

Referring to FIG. 3 and FIG. 4, a third embodiment of the present disclosure is similar to the first embodiment, and differs merely in that the entrance portion 500 is provided on the object 1, and the elastic fastener 5 is provided on the heat dissipating device 2.

Referring to FIG. 3 and FIG. 4, a fourth embodiment of the present disclosure is similar to the second embodiment, and differs merely in that the entrance portion 500 and the wide opening portion 601 are provided on the object 1, and the elastic fastener 5 is provided on the heat dissipating device 2.

Referring to FIG. 1 and FIG. 2, according to a fifth embodiment of the present disclosure, a method of using a fixing structure is provided to use the fixing structure 100 of the first embodiment to couple the heat dissipating device 2 to the heat generating body 10 on the object 1.

Referring to FIG. 1 and FIG. 2, according to a sixth embodiment of the present disclosure, a method of using a fixing structure is provided to use the fixing structure 100 of the second embodiment to couple the heat dissipating device 2 to the heat generating body 10 on the object 1.

Referring to FIG. 3 and FIG. 4, according to a seventh embodiment of the present disclosure, a method of using a fixing structure is provided to use the fixing structure 100 of the third embodiment to couple the heat dissipating device 2 to the heat generating body 10 on the object 1.

Referring to FIG. 3 and FIG. 4, according to an eighth embodiment of the present disclosure, a method of using a fixing structure is provided to use the fixing structure 100 of the fourth embodiment to couple the heat dissipating device 2 to the heat generating body 10 on the object 1.

Figure 11:
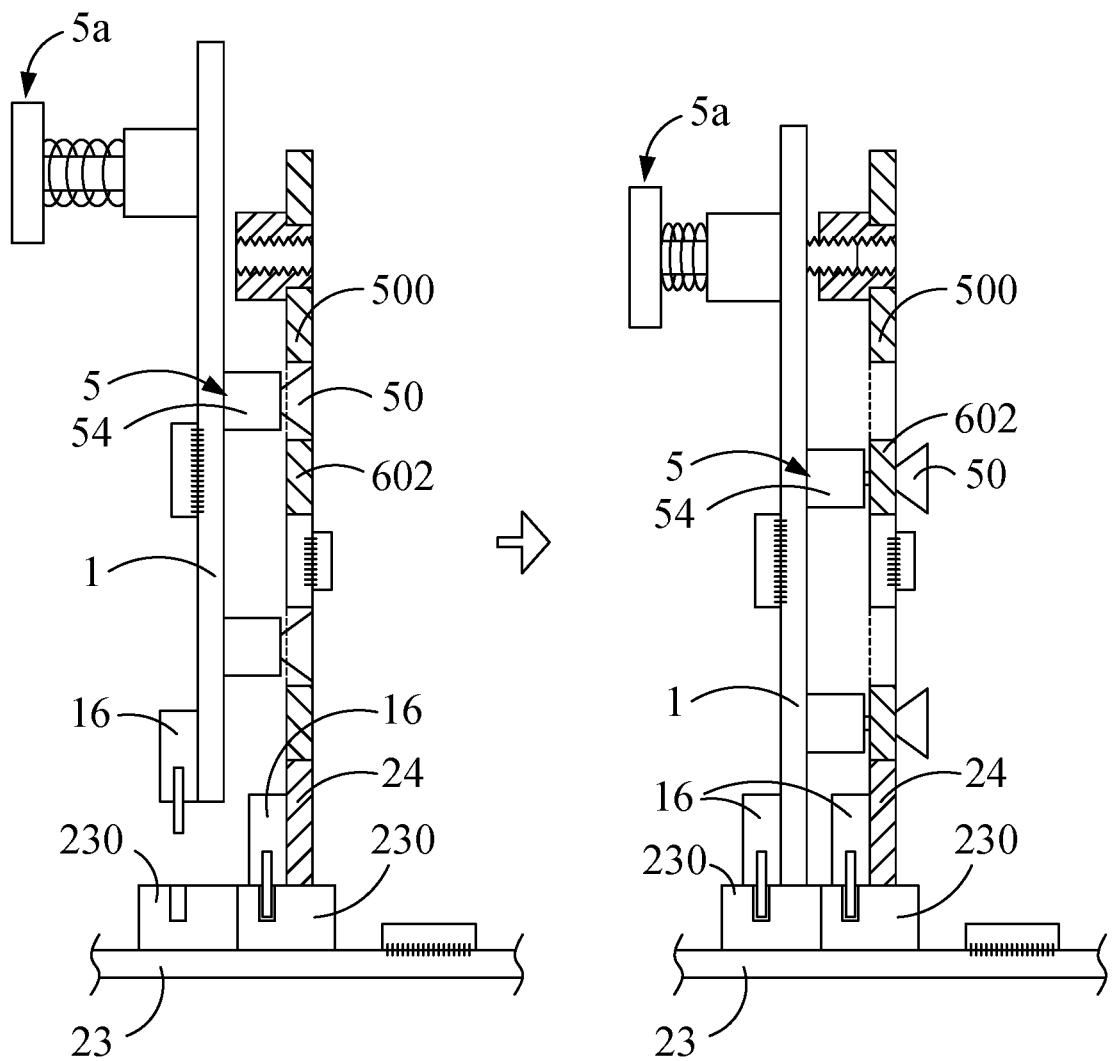
FIG. 11 is a diagram of assembling an object, another object, and a printed circuit board according to an embodiment of the present disclosure.

Referring to FIG. 1, FIG. 2, and FIG. 11, according to a ninth embodiment of the present disclosure, a fixing structure 100 is provided and applied to plug a printed circuit board 23 having a connector 230 to respective another connectors 16 of the object 1 and another object 24. More specifically, the fixing structure 100 is for coupling the another object 24 to the object 1 and includes an entrance portion 500 provided on the another object 24 and the same as that of the first embodiment, and an elastic fastener 5 provided on the object 1 and the same as that of the first embodiment. The elastic fastener 5 is provided on the object 1, and the entrance portion 500 and the slide portion 602 are provided on the another object 24. When the coupling head 50 of the elastic fastener 5 slides to a predetermined position on the slide portion 602, the another connector 16 of the object 1 is also plugged into the connector 230, and the another connector 16 of the another object 24 can be first plugged into the connector 230, or the orders of plugging in can be swapped. In this present embodiment, the elastic element 52 is for providing an elastic force for tightly securing the coupling head 50 to the another object 24, so as to couple the another object 24 to the object 1, and to couple the printed circuit board 23 having the connector 230 to the another object 24 and the respective another connectors 16 connected to the object 1 and the another object 24. The connector 230 may be a plug having a conductive blade, and the another connector 16 may be a corresponding receptacle, or the configurations of the two may be swapped. The printed circuit board 23 is adapted to be plugged into the connector 230 and the another connector 16; however, the present disclosure is not limited to the above examples.

Referring to FIG. 1, FIG. 2, and FIG. 11, a fixing structure 100 is provided according to a tenth embodiment of the present disclosure. This embodiment is similar to the ninth embodiment and the second embodiment, that is, the entrance portion 50 may have a wide opening portion 601 and is in communication with the slide portion 602 via the wide opening portion 601, and the elastic fastener 5 is adapted to allow the coupling head 50 to enter the wide opening portion 601 (as shown in FIG. 2) and then have the rod 51 enter the slide portion 602, thereby enabling the coupling head 50 to contact the another object 24.

Referring to FIG. 1, FIG. 2, and FIG. 11, a fixing structure 100 is provided according to an eleventh embodiment of the present disclosure, and is similar to the tenth embodiment and the second embodiment. The elastic fastener 5 further includes a body 54 provided on the object. The ninth to eleventh embodiments can also be integrated into the first to fourth embodiments. That is, the fixing structure 100 can be simultaneously used to press the heat dissipating device onto the heat generating body 1 and used for plugging and positioning between a plurality of printed circuit boards.

Referring to FIG. 1 and FIG. 2, in one embodiment, the heat generating body 10 may be an integrated circuit, a central processing unit (CPU), a graphics processing unit (GPU), a storage medium, or a hard drive.

Figure 5:
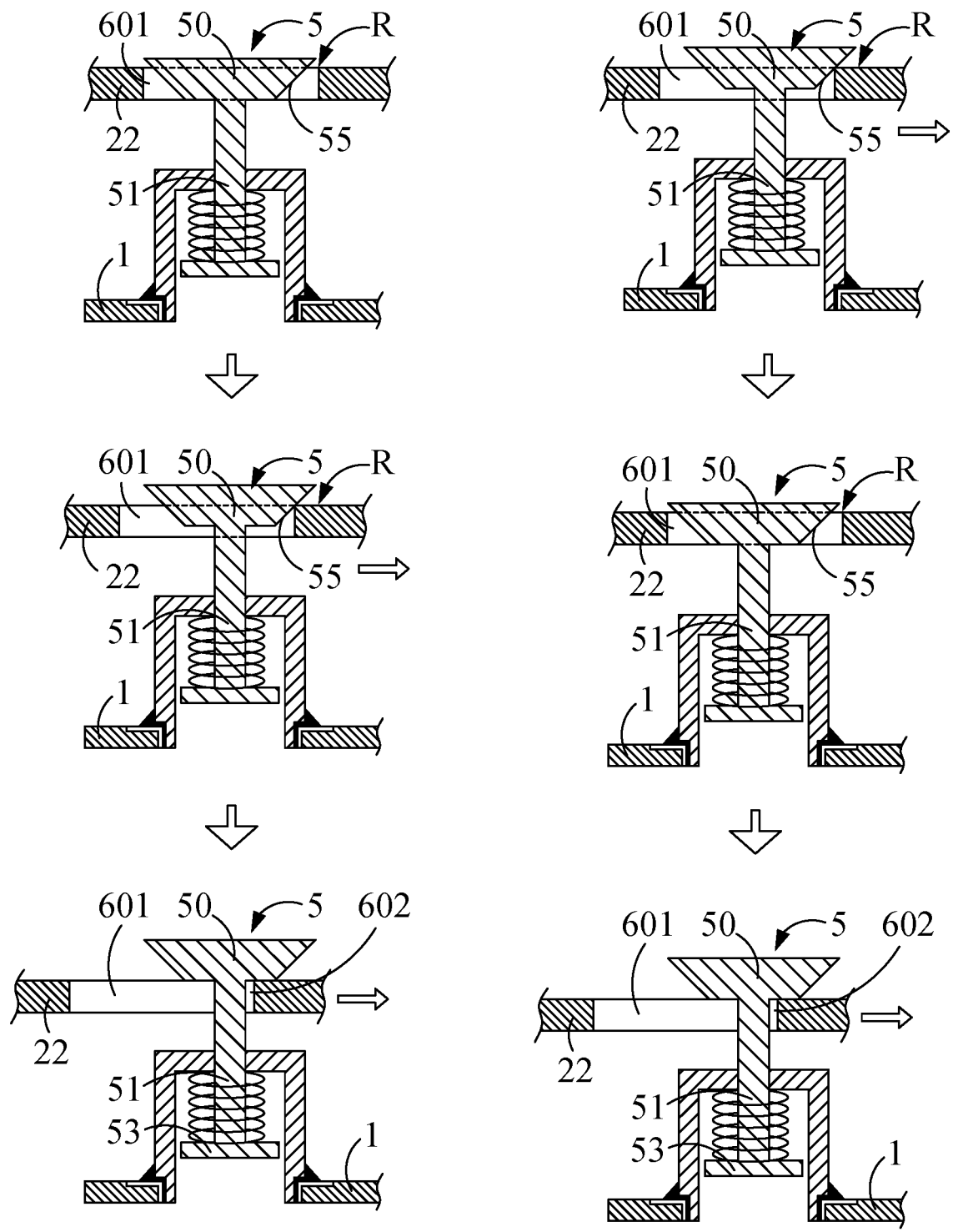
FIG. 5 is a schematic diagram of the operation of the elastic fastener corresponding to FIG. 1 coupling a heat dissipating device.

As shown in FIG. 1, FIG. 2, and FIG. 5, in an embodiment, the heat dissipating device 2 includes a heat sink body 20 having a plurality of cooling fins 21 and two flanges 22 respectively extending on two sides of the heat sink body 20. The wide opening portion 601 and the slide portion 602 in communication with each other may be integrated into a limiting portion 600. Each flange 22 is provided with the entrance portion 500 or the limiting portion 600. The entrance portion 600 may be an opening provided on one side of the flange 22 and extending inward to form a slide portion 602 in the form of an open groove, the rod 51 of the elastic fastener 5 may enter the opening of the entrance portion 500 along a lateral direction and be stopped at an end of the slide portion 602, and the elastic fastener 5 fastens the heat dissipating device 2 onto the object 1 at the end. The limiting portion 600 is an opening provided on an interior of the flange 22. The limiting portion 600 has a larger aperture at the wide opening portion 601 to allow the coupling head 50 of the elastic fastener 5 to enter, and the slide portion 602 has a narrower width to limit up and down movements of the coupling head 50 and to allow the elastic fastener 5 to be received only along the lateral direction. The wide opening portion 601 of the limiting portion 600 may also be regarded as a form in which the entrance portion 500 is located in the flange 22. In FIG. 2, the flange 22 of the heat dissipating device 2 is provided with both the entrance portion 500 and the limiting portion 600, and the object 1 is provided with the elastic fasteners 5 respectively corresponding to the entrance portion 500 and the limiting portion 600; however, the present disclosure is not limited to the above examples. Part of the rod 51 is inserted into the body 54, and the elastic fastener 5 may further include a stop portion 53. The stop portion 53 may be provided at the end of the rod 51 located in the body 54, and the elastic element 52 is, for example, a compression spring capable of abutting between the stop portion 53 and the body 54.

As shown in FIG. 2, FIG. 4, and FIG. 11, in an embodiment, the coupling head 50 of the embodiments above may use a spring force of the elastic element 52 to press against and clamp a corresponding object (the object 1, the heat dissipating device 2, or another object), wherein the spring force may be between 0.00001 kgf and 50 kgf.

As shown in FIG. 3 and FIG. 4, in an embodiment, the two flanges 22 of the heat dissipating device 2 may be used to arrange the elastic fasteners 5, for example, being connected to the bodies 54 of the elastic fasteners 5. Compared to FIG. 1 and FIG. 2, the entrance portion 500 and the limiting portion 600 are provided on the object 1 instead. In FIG. 3, the object 1 is provided with both the entrance portion 500 and the limiting portion 600, and each flange 22 is provided with the elastic fasteners 5 respectively corresponding to the entrance portion 500 and the limiting portion 600; however, the present disclosure is not limited to the above examples.

As shown in FIG. 1 to FIG. 4, and FIG. 11, the object 1 or the another object 24 may be a printed circuit (PCB), a metal plate, a plastic plate, or a non-metal plate.

As shown in FIG. 1 to FIG. 5, in an embodiment, the coupling head 50 may have a guide surface 55. The guide surface 55 is for guiding the coupling head 50 to move onto the slide portion 602 when the rod 51 enters the slide portion 602. The entrance portion 500 or the slide portion 602 has a lift portion R, which is to lift the coupling head 50 when the coupling head 50 is used for coupling. The guide surface 55 or the lift portion R may be an inclined surface, a circular surface, a curved surface, or a stepped surface. The lift portion R may be provided on an edge of the opening of the entrance portion 500, or a boundary between the slide portion 602 and the wide opening portion 601.

Figure 6:
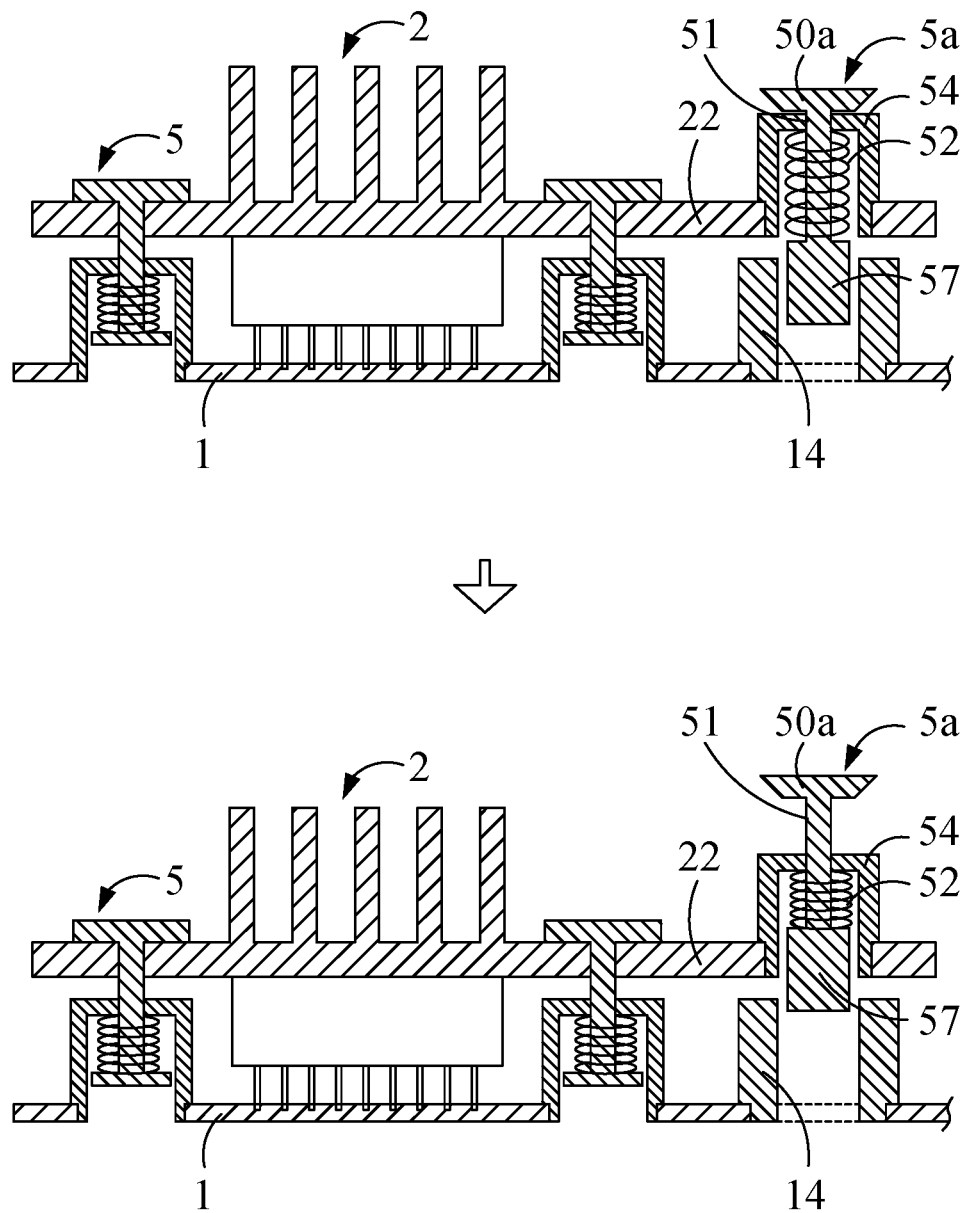
FIG. 6 is a schematic diagram of coupling of another fastener according to an embodiment of the present disclosure.

As shown in FIG. 6 and FIG. 4, the fixing structure 100 of the present disclosure may further include another fastener 5a. When the heat dissipating device 2 and the object 1 are mutually coupled in a predetermined position by the elastic fastener 5 (for example, when the elastic fastener 5 in FIG. 1 or FIG. 3 slides to the end of the entrance portion 500 or the slide portion 602), the another fastener 5a is used to move the heat dissipating device 2 horizontally relative to the object 1 for positioning. For example, the another fastener 5a may be provided on the object 1; once the heat dissipating device 2 and the object 1 are mutually coupled by the elastic fastener 5, the another fastener 5a is used to couple the object 1 to the heat dissipating device 2. Alternatively, the another fastener 5a may also be provided on the heat dissipating device 2; once the heat dissipating device 2 and the object 1 are mutually coupled by the elastic fastener 5, the another fastener 5a is used to couple the heat dissipating device 2 to the object 1. In FIG. 6 and FIG. 4, the another fastener 5a is provided on the flange 22 of the heat dissipating device 2; however, the present disclosure is not limited to the above example. In FIG. 6, the another fastener 5a is in the form of an elastic fastener structure, and in FIG. 4, the another fastener 5a has a threaded body 58; however, the present disclosure is not limited to the above examples. The another fastener 5a may also be provided with a column, an external fastener or an inner fastener. In FIG. 6, the another fastener 5a includes a body 54 connected to the heat dissipating device 2, a rod 51 sleeved on the body 54, an engaging portion 57 provided at a bottom end of the rod 51, an operating head 50a connected to a top end of the rod 51, and an elastic element 52 abutting between the body 54 and the engaging portion 57. The object 1 has an engaged portion 14 in the form of a cylinder. The engaging portion 57 can be coupled with or removed from the engaged portion 14 by rotating the operating head 50a.

As shown in FIG. 2, in an embodiment, the body 54 is connected to the rod 51 and has a weldable surface 56. The weldable surface 56 may also be provided on the object 1, and a solder layer 95 may be provided on the weldable surface 56, so as to perform welding by heating the weldable surface 56 and the solder layer 95.

Figure 10:
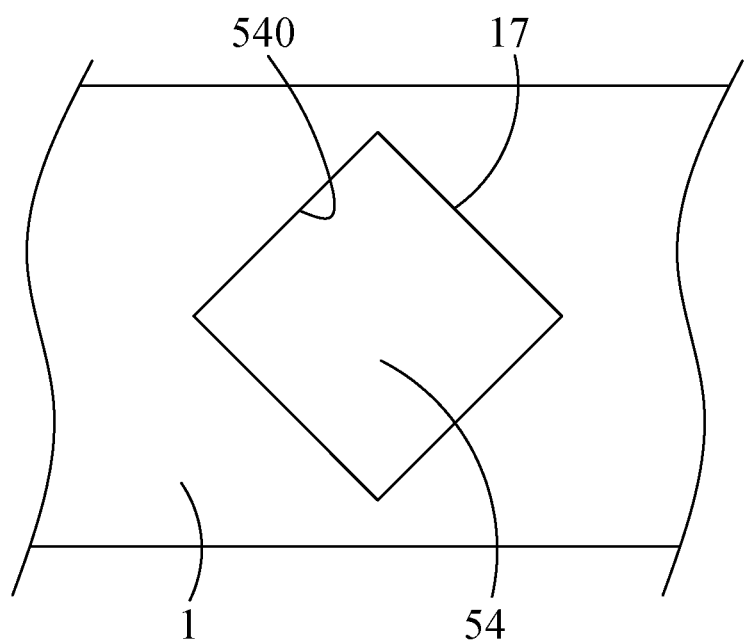
FIG. 10 is a top view schematic diagram of a body in different shapes of an elastic fastener according to an embodiment of the present disclosure.

As shown in FIG. 10, the body 54 has an anti-rotation portion 540. For example, the anti-rotation portion 540 may be in the form of a polygon of the body 54, so as to provide an anti-rotation effect when arranged on the object 1 or the heat dissipating device 2 of FIG. 1 to FIG. 4, and to facilitate an assembly process such as welding. For example, the body 1 may be provided with a corresponding anti-rotation portion 17. The corresponding anti-rotation portion 17 may be a slot or an opening corresponding to the shape of the anti-rotation portion 540, so as to implement an anti-rotation function.

Figure 7:
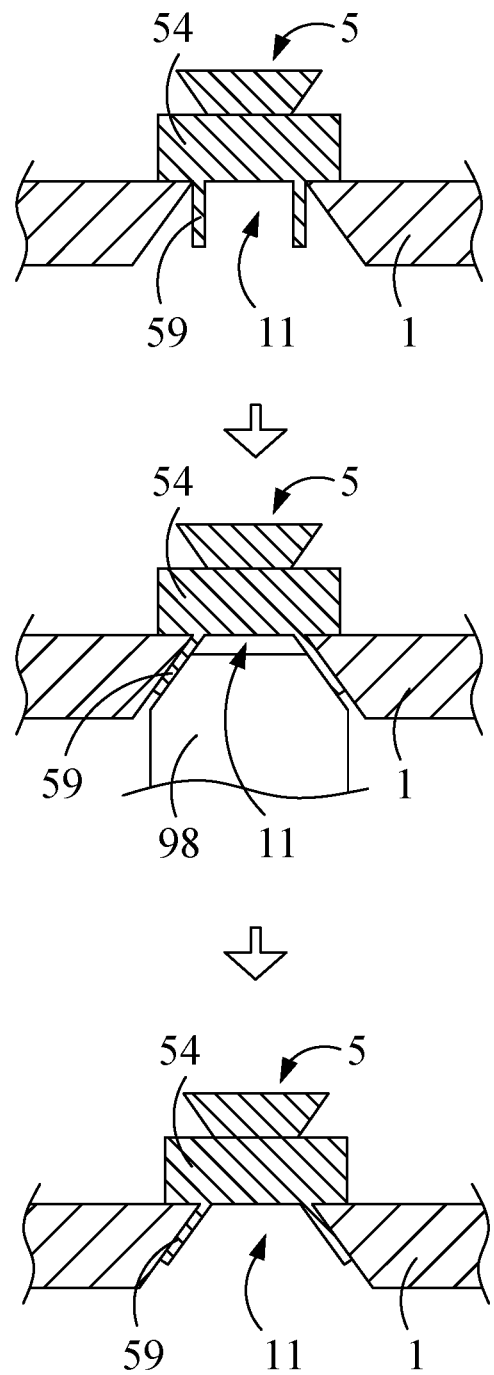
FIG. 7 is a first schematic diagram of coupling of an elastic fastener to a heat dissipating device according to an embodiment of the present disclosure.

As shown in FIG. 7, in one embodiment, a bottom portion of the body 54 of the elastic fastener 5 may be provided with an expansion connecting portion 59, and the object 1 may be provided with an expansion connecting hole 11. With a tightening member 98, the expansion connecting portion 59 is pressed at the expansion connecting hole 11 to connect the body 11 on the object 1. The heat dissipating device 2 in FIG. 4 may also be assembled with the elastic fastener 5 by the same method.

Figure 8:
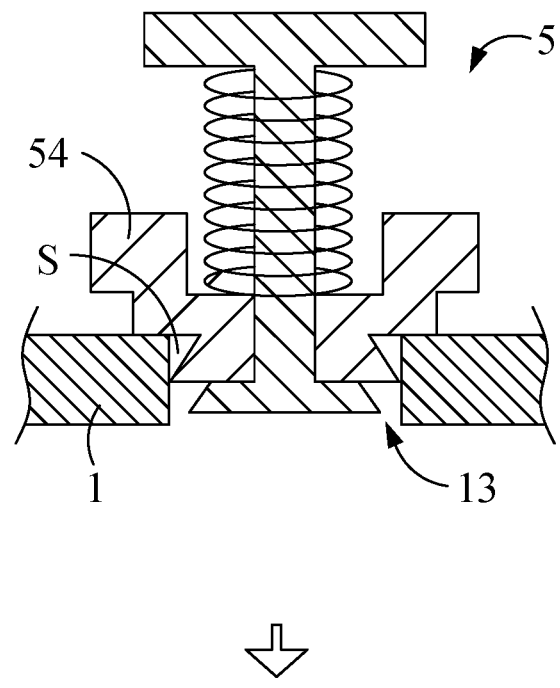
FIG. 8 is a second schematic diagram of coupling of an elastic fastener to a heat dissipating device according to an embodiment of the present disclosure.
Figure 8:
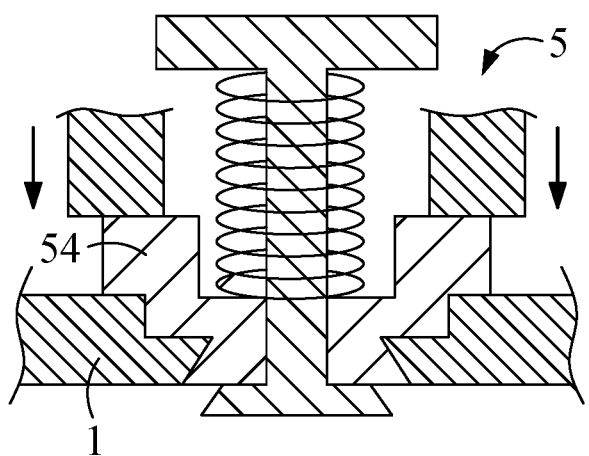

As shown in FIG. 8, in an embodiment, the body 54 of the elastic fastener 5 may have a material storage space S, and the object 1 may be provided with a feed hole 13. By pressing the body 54, a material of the object 1 is enabled to enter the material storage space S to connect the body 54 on the object 1. The heat dissipating device 2 in FIG. 4 may also be assembled with the elastic fastener 5 by the same method. However, the present disclosure is not limited to the above examples. For example, the body 54 may also be provided with an assembly portion in other forms to lock connect or engage connect the object 1.

Figure 9:
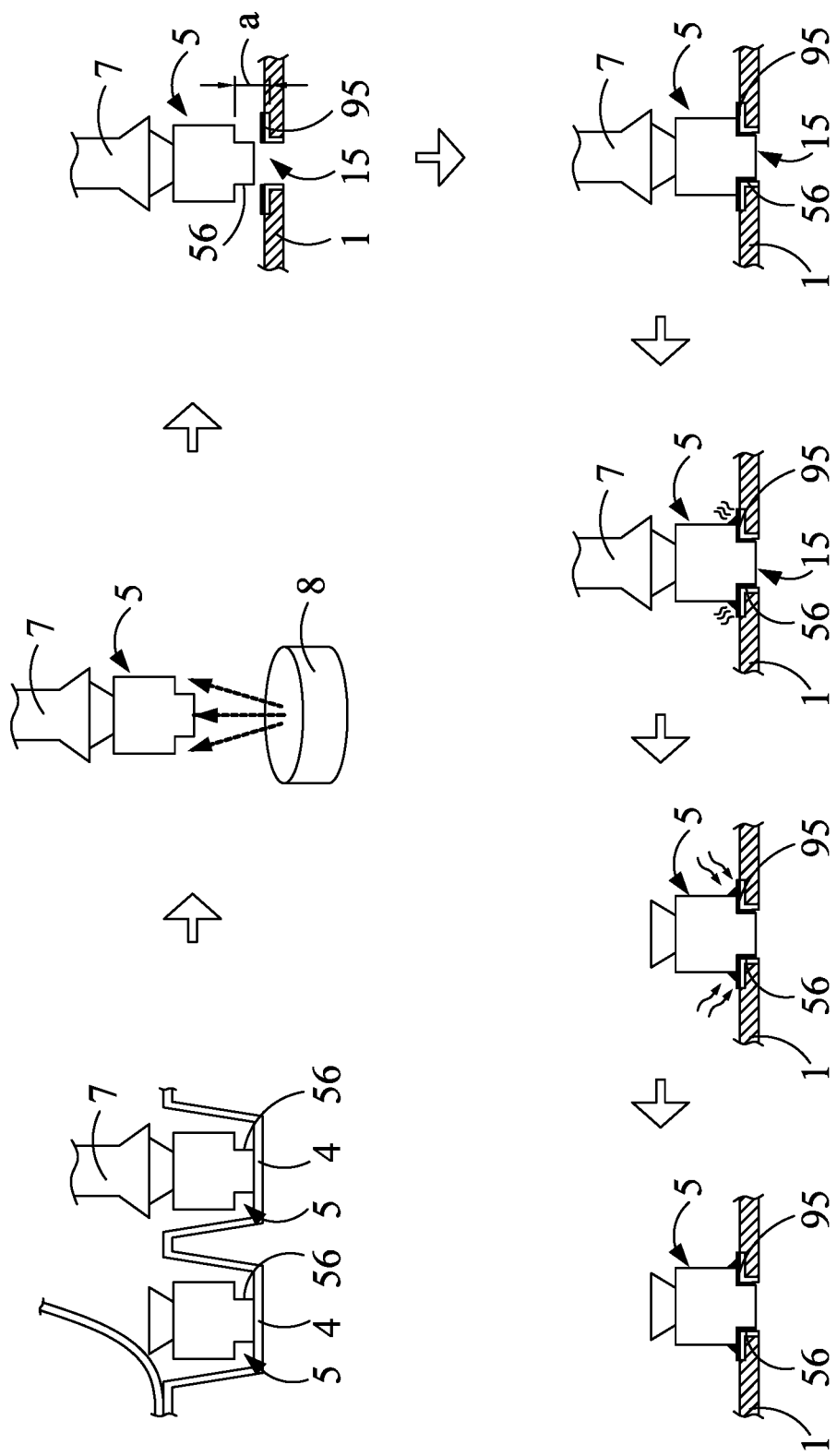
FIG. 9 is a schematic diagram of an assembly method of a fixing structure according to an embodiment of the present disclosure.

Refer to FIG. 9 as well as FIG. 1 to FIG. 4. In another embodiment of the present disclosure, a method for assembling the fixing structure 100 to the heat dissipating device 2 or the object 1 is provided. FIG. 9 depicts an assembly process to the object 1 as an example for illustrations. Before being assembled to the object 1, the fixing structure 100 may be placed in a carrier 4. The fixing structure 100 has the weldable surface 56 used for arranging solder as described above, and the object 1 has a through hole 15. The method includes the steps of:

provinding a tool 7 to pick up the fixing structure 100 from the carrier 4;

using the tool 7 to move the fixing structure 100 to a predetermined height a on an assembly position (that is, the through hole 15) of the object 1; and releasing or setting free the fixing structure 100 from the tool 7, so that the fixing structure 100 drops and becomes placed on the assembly position of the object 1. Thus, the fixing structure 100 can be fixed on the object 1 to improve efficiency of subsequent processes. The tool 7 may be a clamp, a fixture, a vacuum suction device, a magnetic suction device, or an elastic motion element in order to meet actual assembly requirements.

In an embodiment, after the fixing structure 100 is picked up by the tool 7 from the carrier 4, a comparison device 8 may compare the fixing structure 100 with a position or a distance of the assembly position of the object 1, so that the tool 7 moves the fixing structure 100 to the predetermined height a (for example, 0.000001 mm to 10 mm) on the object 1 according to the comparison information of the comparison device 8 and releases or sets free the fixing structure 100, such that the fixing structure 100 drops to the assembly position of the object 1. Then, the weldable surface 56 and the solder 95 are heated and welded to have the fixing structure 100 be welded to the object 1 after the solder 95 has cooled and solidified. In an embodiment, the comparison device 8 may be a vision comparison device, a distance comparison device, an image comparison device, an AI comparison device, or a camera comparison device in order to meet actual assembly requirements.

The present disclosure is described by way of the preferred embodiments above. A person skilled in the art should understand that, these embodiments are merely for describing the present disclosure are not to be construed as limitations to the scope of the present disclosure. It should be noted that all equivalent changes, replacements and substitutions made to the embodiments are to be encompassed within the scope of the present disclosure. Therefore, the scope of protection of the present disclosure should be accorded with the broadest interpretation of the appended claims.

What is claimed is:

1. A fixing structure, applied as a fixing structure of an object to couple to another object, the fixing structure comprising:
    an entrance portion, provided on the another object; and
    an elastic fastener, arranged on the object, and comprising a coupling head, a rod connected to the coupling head, and an elastic element sleeved on the rod;
    wherein, the entrance portion is in communication with a slide portion, or the entrance portion has a wide opening portion and is in communication with the slide portion via the wide opening portion, and the elastic fastener is adapted to enter the slide portion by the rod portion via the entrance portion, and have the coupling head contact the another object, or the elastic fastener is adapted to enter the wide opening portion by the coupling head and then have the rod enter the slide portion, so that the coupling head contacts the another object;
    wherein, the elastic element is for providing an elastic force for tightly securing the coupling head on the another object, so as to couple the another object to the object.

2. The fixing structure according to claim 1, wherein the elastic fastener comprises a body assembled on the rod and arranged on the object.

3. The fixing structure according to claim 1, applied to arrange a heat dissipating device on a heat generating body of the object, wherein the heat dissipating device comprises the fixing structure, or the heat dissipating device is arranged on a heat generating body of the object comprising the fixing structure.

4. The fixing structure according to claim 1, applied to connect a printed circuit board having a connector to the object, wherein the fixing structure of the object is for coupling to another object; or applied to connect a printed circuit board having a connector to the object, wherein the fixing structure of the another object is for coupling to the object or for coupling to the printed circuit board.

5. The fixing structure according to claim 4, wherein the printed circuit board is adapted to connect the connector and another connector.

6. The fixing structure according to claim 4, wherein the printed circuit board is adapted to be hot-plugged with the connector and another connector.

7. The fixing structure according to claim 1, further comprising another fastener, and used for positioning the another fastener when the elastic fastener is coupled and positioned.

8. The fixing structure according to claim 1, wherein the coupling head has a guide surface, which is for guiding the coupling head to move upward onto the slide portion when the rod enters the entrance portion or the slide portion.

9. The fixing structure according to claim 1, wherein the entrance portion or the slide portion has a lift portion, which is for lifting the coupling head when the coupling head is used for coupling.

10. The fixing structure according to claim 1, wherein the elastic fastener further comprises a body, which has an anti-rotation portion for performing corresponding anti-rotation with a corresponding anti-rotation portion correspondingly assembled thereto.

11. The fixing structure according to claim 1, wherein the elastic fastener further comprises a body, and a stop portion provided on the rod, and two ends of the elastic element respectively press against the stop portion and the body, respectively.

12. The fixing structure according to claim 1, wherein the elastic fastener has a body, the body has an assembly portion, the assembly portion has a material storage space for storing a material that enters or flows therein when the object is pressed by an external force, or the assembly portion has an expansion connecting portion for expansion connecting and fit engaging the object, or the assembly portion is for lock connecting, engage connecting, coupling, or weld connecting the object, or the elastic fastener further comprises a body, the body is assembled on the rod and has a weldable surface for welding to a printed circuit board, wherein the printed circuit board has a weldable surface, the weldable surface has a solder layer, wherein cooled and solidified solder after heating and welding is welded between the body and the printed circuit board, or the elastic fastener is adapted to be picked up and moved by a tool, and the elastic fastener is released or set free from the tool so as to be arranged at the assembly position.

* * * * *